(12) United States Patent
Hartmann et al.

(10) Patent No.: US 9,601,716 B2
(45) Date of Patent: Mar. 21, 2017

(54) SHORTS PREVENTION IN ORGANIC LIGHT-EMITTING DIODES

(75) Inventors: Soeren Hartmann, Baesweiler (DE); Michael Buechel, Aachen (DE); Thomas Juestel, Witten (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 771 days.

(21) Appl. No.: 13/130,455

(22) PCT Filed: Nov. 18, 2009

(86) PCT No.: PCT/IB2009/055127
§ 371 (c)(1),
(2), (4) Date: May 20, 2011

(87) PCT Pub. No.: WO2010/061313
PCT Pub. Date: Jun. 3, 2010

(65) Prior Publication Data
US 2011/0220957 A1    Sep. 15, 2011

(30) Foreign Application Priority Data

Nov. 25, 2008 (EP) .................................. 08169893

(51) Int. Cl.
*H01L 51/52* (2006.01)
(52) U.S. Cl.
CPC ...... *H01L 51/5253* (2013.01); *H01L 51/5221* (2013.01); *H01L 51/5231* (2013.01); *H01L 51/5237* (2013.01); *H01L 2251/5392* (2013.01); *H01L 2251/568* (2013.01)

(58) Field of Classification Search
None
See application file for complete search history.

(56) References Cited

U.S. PATENT DOCUMENTS

| 5,730,954 | A | 3/1998 | Albayrak et al. |
| 2002/0083640 | A1 | 7/2002 | Finkelshtain et al. |
| 2004/0099862 | A1 | 5/2004 | Suzuki et al. |
| 2004/0160167 | A1* | 8/2004 | Arai et al. ............ 313/500 |

(Continued)

FOREIGN PATENT DOCUMENTS

| JP | 2001291579 A | 10/2001 |
| JP | 2004214084 A | 7/2004 |
| WO | 2006027736 A1 | 3/2006 |

OTHER PUBLICATIONS

Machine English translation of Takano et al. (JP 2001-291579 A). Jun. 21, 2015.*

(Continued)

*Primary Examiner* — J. L. Yang

(57) ABSTRACT

An organic light emitting diode comprising a first electrode layer, a second electrode layer, a stack of functional layers, including an organic light-emitting layer, sandwiched between said first electrode layer and said second electrode layer, and an passivation layer arranged adjacent to said first electrode layer is disclosed. The passivation layer reacts with the first electrode layer to form an oxide at a reaction temperature that is induced by an evolving short circuit between the first electrode layer and the second electrode layer. The passivation layer is unreactive at temperatures lower than the reaction temperature.

14 Claims, 3 Drawing Sheets

(56) References Cited

U.S. PATENT DOCUMENTS

2005/0225234 A1 10/2005 Tyan et al.
2006/0194075 A1 8/2006 Miyamoto et al.
2007/0141391 A1* 6/2007 Coggan et al. ............... 428/690
2007/0257607 A1 11/2007 Arai et al.

OTHER PUBLICATIONS

Bernards et al., "Shorts prevention in organic light-emitting diodes", Philips Internal Document, p. 3, Jul. 6, 2007.

* cited by examiner

SHORTS PREVENTION IN ORGANIC LIGHT-EMITTING DIODES

FIELD OF THE INVENTION

The present invention relates to a light emitting diode comprising a first electrode layer, a second electrode layer, a stack of functional layers, including an organic light-emitting layer, sandwiched between said first electrode layer and said second electrode layer, and a passivation layer arranged adjacent to said first electrode layer.

BACKGROUND OF THE INVENTION

An organic light emitting diode (LED) (both polymer based organic LEDs and small molecule organic LEDs) consists of a stack of organic layers sandwiched between an anode and a cathode. The organic stack contains both the light-emitting layer or layers in case of stacking and one or more charge carrier and/or charge injecting layers. When a voltage is applied across the organic stack, light is produced.

In order to prevent degradation of the device by interaction with the ambient atmosphere, the device needs encapsulation. Water vapor is considered the harmful component. Even with an encapsulating cover a water absorbing and/or moisture absorbing getter material is inserted in the cavity between the cover and the substrate to remove water penetrating through the glue that is used as an edge sealant for the cover.

In order to exploit the potential of organic LEDs in commercial products, reliable operation of the devices is a prerequisite. Though the intrinsic lifetime is sufficiently long to allow several applications of organic LEDs, both as display and as light source, the occurrence of early failures by electrical shorts limits the practical lifetime of devices based on this technology.

The layered structure of an organic LED comprises individual thin layers, that are produced by processes such as, for example, vacuum vapor deposition or spin casting. In such coating processes, the presence of particles, such as dust particles for example, leads to layer defects. The dimensions of such particles are usually appreciably larger than the thicknesses of the individual layers. The size and shape of the layer defects depend on the position and geometry of the particle and on the point in time from which the particle was present on the growing layered structured during the production of the thin layers. Such layer defects may lead to the formation of electrical shorts between the anode and the cathode.

Electrical shorts between the cathode and the anode may be present in the device directly after processing or may be are formed during operation of the device. The former results in a decrease of the yield of production of the devices; the latter is a reliability issue in the application of the device.

The international application WO 2006/027736 discloses an electroluminescent arrangement having a layered structure with an organic luminescent layer between an anode and a cathode. A dielectric layer having an oxygen concentration of more than 2 ppm is provided for complete wetting of the layered structures to prevent electrical flashovers. Thereby, in the regions of layer defects, unintended conductive bridges between the cathode and anode are oxidized and hence their conductivity is reduced. In this way the risk of flashovers is reduced.

However, the content of oxygen in the dielectric layer is rather limited, and such a layer possibly interacts with the performance of the device. Thus, there is a continuing need for a device optimized with respect to efficacy and intrinsic lifetime and a remedy against shorts without concession to these parameters.

SUMMARY OF THE INVENTION

An object of this invention to provide an electrical passivation in organic LEDs, which electrical passivation results in a clear reduction in the failure rate due to leakage current and short-circuits without the use of costly cleanroom technology.

This object is achieved by an organic light emitting diode comprising a first electrode layer; a second electrode layer; a stack of functional layers, comprising an organic light-emitting layer (or more layers in case of stacking) sandwiched between said first electrode layer and said second electrode layer; and a passivation layer arranged adjacent to said first electrode layer; characterized in that said passivation layer reacts with said first electrode layer to form a passive material at a reaction temperature that is induced by an evolving short circuit between said first electrode layer and said second electrode layer, said passivation layer being unreactive at temperatures lower than said reaction temperature.

The term "passive material" in the sense of the present invention especially means and/or includes all materials which are not or hardly conductive under the operation conditions of the organic light emitting diode. Preferably the passive material is and/or comprises an oxide and/or an alkoxide.

Activation of the oxidizing agent in the layer is induced by heat production in the process of short formation, i.e. the increasing local leakage current. Subsequent oxidation of the electrode prevents further evolution of the short and leads to reduction of the leakage current.

A significant advantage of the present invention is that it provides for application of passive material locally, i.e. at spots where it is necessary to passivate an evolving short. In the major part of the device, where no evolving shorts are present, the passive material is not supplied.

In a first embodiment of the invention, said passive material is formed by a solid phase reaction.

In a second embodiment of the invention, said passivation layer comprises a material which has a decomposition temperature below the melting temperature of said first electrode layer, and said material decomposes at said reaction temperature. According to this second embodiment, the passivation material is formed by a sequence of the release of a passivating agent selected from $O_2$, $H_2O$, $CO_2$, MeOH, HCOOH and $N_2O$ from said passivation layer and a subsequent reaction.

In a more detailed and preferred embodiment, said passivation layer comprises at least one clathrate material, which decomposes at said reaction temperature. By doing so, the passivation material can for many applications be released more efficiently.

According to a preferred embodiment of the present invention, said clathrate material comprises at least one passivating agent selected from $O_2$, $H_2O$, $CO_2$, MeOH, HCOOH and $N_2O$. According to a preferred embodiment of the present invention, said clathrate material furthermore comprises at least one material and/or compound selected out of the group comprising:
  quinones and naphtoquinones,
  Dianin's compound (i.e. 4-p-Hydroxyphenyl-2.2.4-trimethylchroman)

steroids, substituted steroids
cholic acid, deoxycholic acid and derivatives thereof
urea, thiourea and N-alkylated and N-arylated derivatives thereof
Triphenylcarbinols and derivatives thereof
Perhydrotriphenylenes and derivatives thereof
or mixtures thereof.

In another preferred embodiment of the invention, said passivation layer comprises an organic and/or inorganic peroxide material. These materials have shown to be suitable materials for a wide range of applications within the present invention.

Preferably said organic and/or inorganic peroxide material is selected out of the group comprising:
  metal peroxides, preferably alkali and/or earth alkali peroxides, preferably Barium peroxide, and/or zinc peroxide.
  peroxide salts which are derived from inorganic acid salts, preferably alkali percarbonates, periodates, perborates, persulfates, peroxodisulfates, perbromates, perchlorates
  organic peroxides such as (but not limited to) t-butylperoxide, Di-t-butylperoxide Benzoylperoxide, Benzoyl-alkyl-peroxides (especially Benzoyl-t-butylperoxide), anthracenperoxide, ascaridol, MCPBA, Trifluorperethanolic acid and mixtures thereof.

In all embodiments, the passive material is formed by a reaction between said passivation layer (or material released by said passivation layer, e.g. in case said passivation layer comprises a clathate material) and said first electrode.

The first electrode is preferably a cathode layer, comprising low work-function metals, or low work-function metals in combination with a protective metal layer and/or comprising a silver material.

The second electrode layer is preferably an anode layer, e.g. comprising indium tin oxide (ITO).

Preferably, the stack of functional layers and said passivation layer are arranged at opposite sides of the cathode.

The present invention also relates to s display device and a light source comprising an organic light emitting diode according to the above, as well as to a method for the manufacture thereof.

These and other aspects of the invention are apparent from and will be elucidated with reference to the embodiments described hereinafter.

DETAILED DESCRIPTION OF EMBODIMENTS

Figure 1:
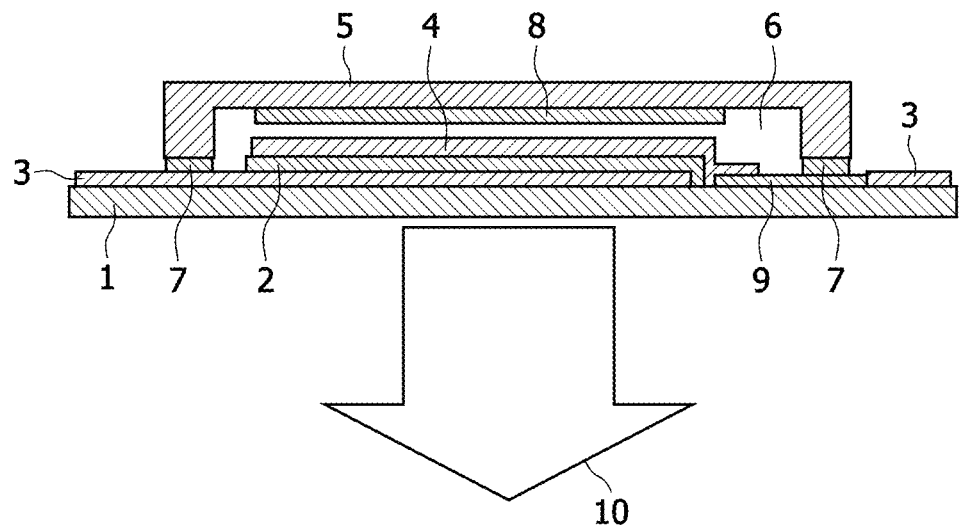
FIG. 1 shows a schematic layout of an encapsulated organic LED.

FIG. 1 is a side view of an encapsulated organic LED. In accordance with the present invention, both LEDs based on small molecules (smOLEDs) or polymers (PLEDs) are included. The layered structure of the LED includes a thin organic luminescence layer 2 of a typical thickness in the 100 nm range, which layer is arranged between two electrodes (such as, for example, an anode 3 and a cathode 4 as shown in FIG. 1) at least one of which is transparent. In the standard bottom-emitting devices indium tin oxide (ITO) is used as a transparent anode. A low-workfunction metal like Ba or LiF (which reacts with Al to metallic Li) covered with a protective metal like Al or Ag is used as the non-transparent cathode. The layer thicknesses of these metals and compounds are typically a few nms and about 100 nm, respectively. Other materials and arrangements in which both the electrodes are transparent are also applied.

The layered structure is mounted on a substrate 1. A distinction is made in this case between what are termed top and bottom emitters. Bottom emitters emit the light 10 from the luminescence through the substrate 1, as shown in FIG. 1. In this case the anode 3 comprises an ITO layer and the cathode 4 a layer of aluminium. The layered structure may also be applied to the substrate in the reverse order. A top emitter of this kind then emits the light not through the substrate in the way shown in FIG. 1 but in the opposite direction. These top emitters can be created by different anode and cathode compositions, resulting in optically transparent cathodes and reflecting anodes. Obviously, fully transparent devices can be created as well by application of both transparent anodes and cathodes.

Between the organic luminescence layer 2 and the anode 3, there is generally arranged a layer of p-type conductivity, having a thickness of approximately 50 nm. The thin electron injection layer made of a material having a low work function, such as, for example, lithium, cesium or barium, which layer enables injection of electrons into the luminescence layer, shows a very sensitive reaction to moisture. Therefore, to provide protection against ambient moisture, electroluminescence arrangements are provided with an encapsulating device. This encapsulating device comprises a cover 5 that, by means of adhesive-bonded joints 7, encloses the layered structure having the organic luminescence layer 2 and is firmly connected thereto.

In addition, a getter material 8 may be arranged inside the encapsulation to reduce the proportion of moisture/water within the volume of space 6. In so-called top emitters, the encapsulation, or at least the cover 5, has to be transparent. The forms and positions shown here for the getter material 8 and the cover 5 merely represent possible embodiments. In other embodiments, the positions and forms may also be of some other kind. To enable the layered structure situated inside the encapsulation to be driven electrically, conductive tracks 9 and 3 are run out of the encapsulation.

In addition to the layered structure shown in FIG. 1, additional layers for improving the light outcoupling may be added between the anode and the organic luminescence layer, such as micro-cavity layers, layers for changing or improving colors, scattering layers and/or hole injection layers. These possible additional layers do not change anything in the way in which, as described, the basic object is achieved in accordance with the invention.

Figure 2:
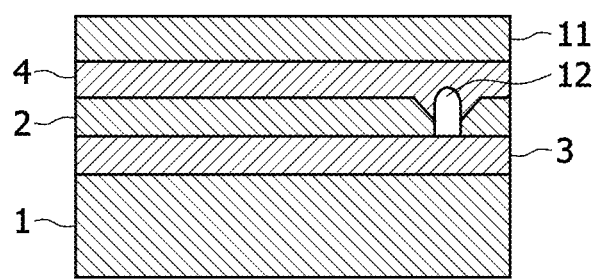
FIG. 2 shows a schematic diagram of the proposed solution for shorts prevention.

FIG. 2 shows the schematic diagram of the proposed solution according to the present invention, wherein a passivation layer 11 is arranged on the cathode layer 4.

The presence of a particle 12, e.g. a dust particle, leads to the substrate that is being coated or part of the layered structure being shaded off, and hence to layer defects of the kind shown in FIG. 2. The presence of the particle can lead to a short. A short between the cathode 4 and anode 3 means that the imposed current does not contribute, or only contribute to a minor extent, to the generation of light. Because of its local nature the short current also leads to local heating of the layered structure.

Two types of shorts may occur:

If, due to a particle 12, the organic layer 2 is no longer present in the region of a layer defect, or, if the particle is conductive and creates a direct contact between anode and cathode, the short will occur in the device as processed. This would imply a yield problem in production because these devices will be rejected.

If, due to the particle 12, the organic layer 2 is disturbed, e.g. becomes thinner, a short may evolve during lifetime as a result of locally accelerated ageing. The disturbed layer may occur around a non-conducting particle or on top of a conducting particle. This second type of short implies a reliability problem as it occurs during application of the device at an unpredictable moment (sudden death). The second type of short is considered as the most serious one.

The present invention provides a LED having an passivation layer 11 covering the cathode layer 4, which reacts with the cathode to form an passive material at a reaction temperature that is induced by an evolving short circuit between the first electrode layer and the second electrode layer. The passivation layer is unreactive at temperatures lower than the reaction temperature. The passivation layer is preferably a solid phase layer. The passive material is formed locally in the area of the first electrode (preferably the cathode) which is affected by the higher temperature induced by the evolving short. In absence of this local oxidation of the cathode, a short circuit would arise.

In this connection, the term "unreactive" means that the passivation layer does not react with any of the electrodes to form an passive material, and "lower temperatures" means normal operational temperatures of the device, far below the temperature induced by an evolving short circuit.

By the "reaction temperature" is meant a temperature somewhere between the operational temperature of the device (<100° C.) and the final temperature of an actual short. In a fully evolved short the temperature raise is sufficient to melt the cathode (in the case of aluminium at a temperature of about 660° C.). Therefore, the temperature window for the reaction temperature is many 100s° C.

In a first embodiment of the invention, the passivation layer 11 has the ability to react directly with the cathode 4 to form a local passive material at the temperature that is induced by evolving short. Thereby, in the region of layer defects, unintended bridges between the cathode 4 and anode 3 are oxidized and hence their conductivity is greatly reduced.

In this first embodiment of the invention, the passivation layer 11 acts as an oxidizing agent with respect to the cathode 4 by a direct reaction in the solid phase, i.e. a so called "solid phase reaction". As used herein, a "solid state reaction" relates to a reaction without gasification of one of the reactants, i.e. direct transfer of oxygen from the passivating material (e.g. BaO) towards the metal (Al) resulting in a metal of the original passive material and the passive material of the cathode (see example 2). It will prevent the evolution of the short if the metal passive material reacts locally with the cathode to form an passive material and a metal at the temperature that is induced by the evolving short.

One example of a passivating material to be used according to the first embodiment of the invention is barium oxide (BaO). According to the first embodiment of the invention, the passivation layer can be applied by direct evaporation on top of the cathode. Alternatively, a metal can be applied on top of the cathode by evaporation, followed by an oxidation step.

In a second embodiment of the invention, the passivation layer 11 has a decomposition temperature below the melting temperature of the cathode 4, and acts as an oxidizing agent with respect to the cathode 4 by a sequence of the thermal release of the oxidizing agent and an oxidizing reaction upon an evolving short.

As used herein, the term "decomposition temperature" relates to the temperature at which the passivation layer decomposes into smaller substances, of which at least one is an oxidizing agent.

The "decomposition temperature" essentially corresponds to the "reaction temperature", as defined above.

The passivation layer is arranged adjacent to either of the electrode layers, preferably the cathode layer. Preferably, the passivation layer is applied on top of the cathode, i.e. the stack of functional layers and the passivation layer are arranged at opposite sides of the cathode.

Examples of materials to be used as cathode materials according to the present invention are low work-function metals, and low work-function metals in combination with a protective metal layer. For example, the cathode may comprise aluminium (Al) or ytterbium (Yb). Al serves as a protective layer, and its application needs an additional low work-function metal e.g. Ba or Ca or LiF (which reacts with Al during evaporation). In that case, the cathode metal is applied on top of the low-workfunction metal. In the case of Yb, the metal serves both as the contact metal like Al and as the low work-function electron-injector. One examples of a material to be used as an anode material according to the present invention is indium tin oxide (ITO). However, the functionality of the oxidizing agent is independent of the type of anode. The functionality of the oxidizing agent depends on the oxidation of the cathode only.

As used herein, the term "stack of functional layers" relates to the organic luminescence layer 2 and any additional layers, e.g. layers of p-type conductivity, and electron injection layers, which are included in the organic LED to improve its functionality. Such layers are very well known to persons skilled in the art. The stack of functional layers is sandwiched between the first and second electrode, i.e. arranged between said electrodes.

By the expression "an passivation layer arranged adjacent to said first electrode layer" is meant that the passivation layer and the electrode layer are in contact with each other in such a way that the decomposition of the passivation layer into at least one oxidizing agent leads to oxidation of the first electrode layer, and/or that said passivation layer reacts directly with the first electrode layer to form a passive material (e.g. an oxide, alkoxide and/or formiate) at the temperature that is induced by an evolving short circuit between said first electrode layer and said second electrode layer.

As used herein, the term "oxidizing reaction" relates to a chemical reaction in which a substance is oxidized. As used herein, the term "redox reaction" relates to a chemical reaction in which a substance is oxidized while another substance is reduced.

EXAMPLES

Example I

As a first example of the present invention, several OLEDs were build having a passivation layer with an approx. size of 44×43 mm$^2$. All OLEDs were setup in that way that the passivation layer could be build in a cavity present in the oled, having an approx. depth of 0.6 or 0.7 mm.

The cavity was filled with 90-100 µl percarbonate (OXYPER, Solvay) so as to fill the cavity.

Figure 3:
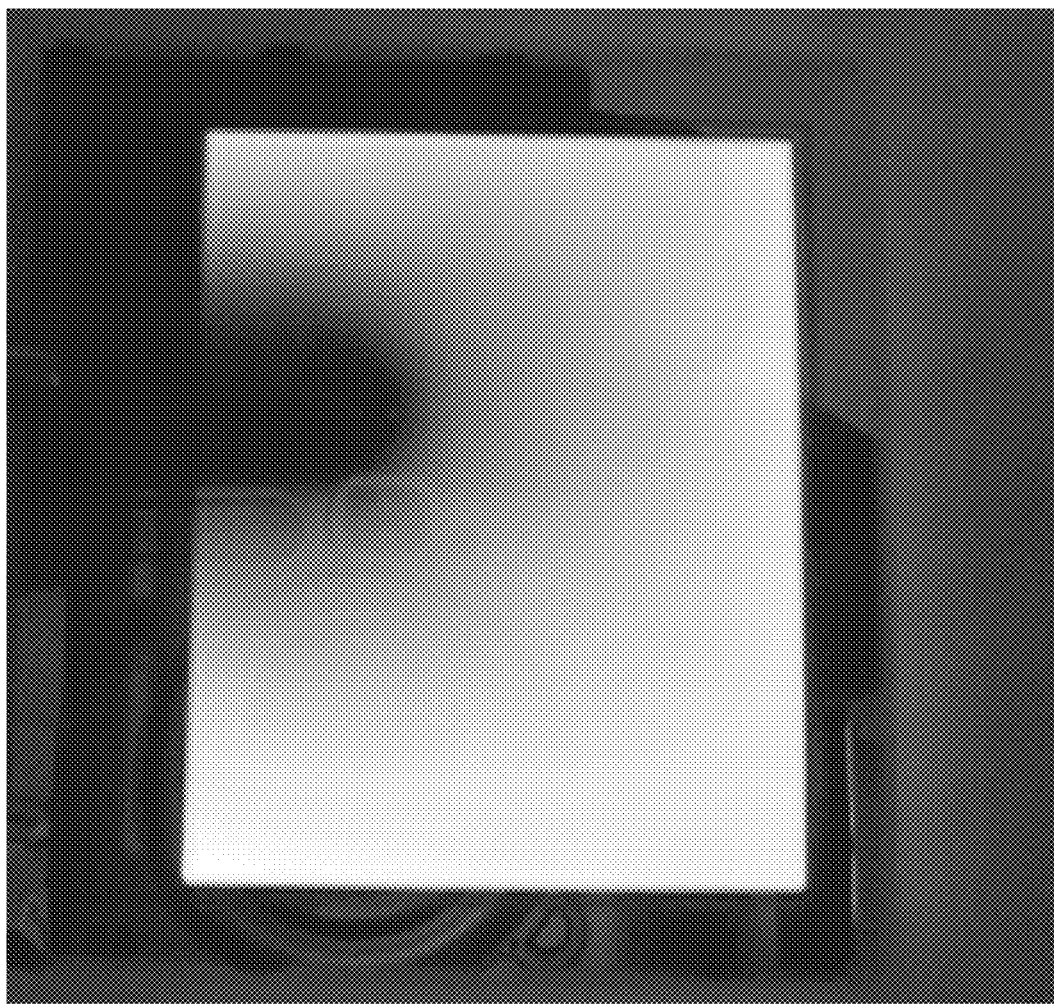
FIG. 3 shows a picture of an OLED with a short using a setup according to Example 1 of the present invention.
Figure 4:
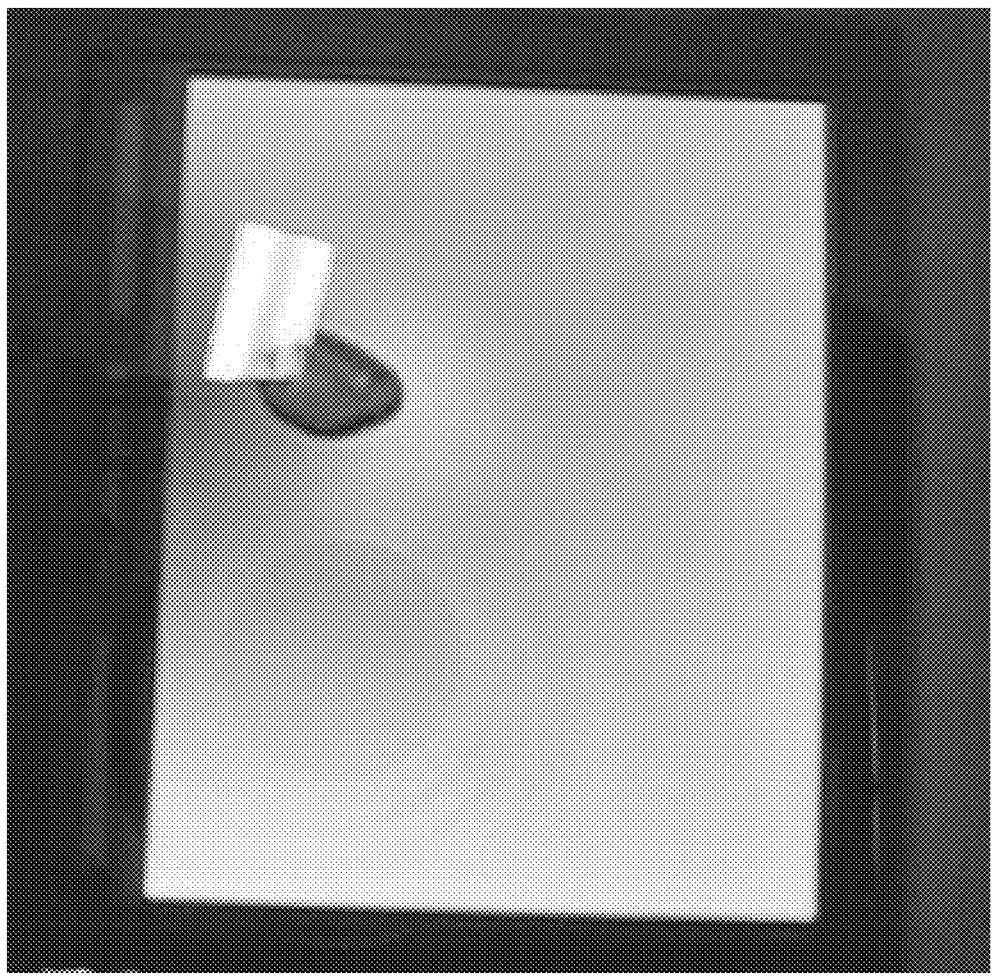
FIG. 4 shows a picture of the same OLED after the "curing" of the short.

When the OLEDs were operated, a short could be observed in a few of the OLEDs. FIG. 3 shows a picture of one example. However, due to the passivation layer, after some minutes, the short was "cured".

Example II

As a second example of the present invention, several OLEDs were build having a passivation layer with an approx. size of 44×43 mm$^2$. All OLEDs were setup in that way that the passivation layer could be build in a cavity present in the OLED, having an approx. depth of 0.6 or 0.7 mm. The cavity was filled with 90-100 µl Zincperoxide (Sigma-Aldrich, 50-60%) so as to fill the cavity. After dispensing of glue on the cover lid, the cover lid was filled with the powder. Then the substrate was pressed onto the cover lid and the hardening of glue was initiated by heat or UV-light.

The OLEDS were tested with 100 mA in continuos performance. After one week, no shorts were observed.

The embodiments that have been elucidated by reference to the drawings and in the description are only examples of LEDs according to the invention, and are not to be construed as limiting the invention to these examples.

The invention claimed is:

1. An organic light emitting diode, comprising:
   a first electrode layer;
   a second electrode layer;
   a stack of functional layers, comprising an organic light-emitting layer and disposed between said first electrode layer and said second electrode layer; and
   a passivation layer arranged adjacent to said first electrode layer, said passivation layer being reactive with said first electrode layer to form a passive material at a reaction temperature induced by an evolving short circuit between said first electrode layer and said second electrode layer, said passivation layer being non-reactive at temperatures lower than said reaction temperature,
   wherein said passivation layer comprises at least one clathrate material, which decomposes at said reaction temperature.

2. The organic light emitting diode according to claim 1, wherein said passive material comprises an oxide and/or an alkoxide.

3. The organic light emitting diode according to claim 1, wherein said passivation layer has a decomposition temperature below the melting temperature of said first electrode layer, and said passivation layer decomposes at said reaction temperature.

4. The organic light emitting diode according to claim 3, wherein said passive material comprises an oxide and/or an alkoxide and wherein said oxide and/or said alkoxide is formed by a sequence of the release of a passivating agent from said passivation layer.

5. An organic light emitting diode comprising:
   a first electrode layer;
   a second electrode layer;
   a stack of functional layers, comprising an organic light-emitting layer and disposed between said first electrode layer and said second electrode layer; and
   a passivation layer arranged adjacent to said first electrode layer, said passivation layer being reactive with said first electrode layer to form a passive material at a reaction temperature induced by an evolving short circuit between said first electrode layer and said second electrode layer, said passivation layer being non-reactive at temperatures lower than said reaction temperature,
   wherein said passive material comprises an oxide and/or an alkoxide and wherein said oxide and/or said alkoxide is formed by a sequence of a release of a passivating agent from said passivation layer,
   wherein said passivating agent is selected from the group consisting of: $O_2$, $H_2O$, $CO_2$, MeOH, HCOOH and $N_2O$.

6. The organic light emitting diode according to claim 1, wherein said clathrate material comprises at least one passivating agent selected from the group consisting of: $O_2$, $H_2O$, $CO_2$, MeOH, HCOOH and $N_2O$.

7. The organic light emitting diode according to claim 1, wherein said clathrate material comprises at least one compound selected out of the group consisting of:
   quinones and naphtoquinones,
   4-p-Hydroxyphenyl-2.2.4-trimethylchroman,
   steroids,
   cholic acid, deoxycholic acid and derivatives thereof,
   urea, thiourea and N-alkylated and N-arylated derivatives thereof,
   Triphenylcarbinols and derivatives thereof, and
   Perhydrotriphenylenes and derivatives thereof.

8. An organic light emitting diode, comprising:
   a first electrode layer;
   a second electrode layer;
   a stack of functional layers, comprising an organic light-emitting layer and disposed between said first electrode layer and said second electrode layer; and
   a passivation layer arranged adjacent to said first electrode layer, said passivation layer being reactive with said first electrode layer to form a passive material at a reaction temperature induced by an evolving short circuit between said first electrode layer and said second electrode layer, said passivation layer being non-reactive at temperatures lower than said reaction temperature,
   wherein said passivation layer comprises an organic and/or inorganic peroxide material.

9. The organic light emitting diode according to claim 8, wherein said peroxide material is selected from the group consisting of:
   alkali and/or earth alkali peroxides and/or zinc peroxide,
   alkali percarbonates, periodates, perborates, persulfates, peroxodisulfates, perbromates, perchlorates, and
   t-butylperoxide, Di-t-butylperoxide, Benzoylperoxide, Benzoyl-alkyl-peroxides, anthracenperoxide, ascaridol, MCPBA, Trifluorperethanolic acid and mixtures thereof.

10. The organic light emitting diode according to claim 1, wherein said first electrode layer comprises a low work-function metal in combination with a protective metal layer.

11. The organic light emitting diode according to claim 1, wherein said second electrode layer comprises indium tin oxide (ITO).

12. A display device comprising an organic light emitting diode according to claim 1.

13. A light source comprising an organic light emitting diode according to claim 1.

14. The organic light emitting diode according to claim 1, wherein said passive material is formed through a solid state reaction with said first electrode at said reaction temperature.

\* \* \* \* \*